(12) United States Patent
Duan et al.

(10) Patent No.: US 12,049,697 B2
(45) Date of Patent: Jul. 30, 2024

(54) MULTILAYER ALD COATING FOR CRITICAL COMPONENTS IN PROCESS CHAMBER

(71) Applicant: Taiwan Semiconductor Manufacturing Company, Ltd., Hsinchu (TW)

(72) Inventors: Ren-Guan Duan, Hsinchu (TW); Chen-Hsiang Lu, Hsinchu (TW); Chiun-Da Shiue, Hsinchu (TW); Chih-Kai Hu, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/818,336

(22) Filed: Aug. 8, 2022

(65) Prior Publication Data
US 2024/0043992 A1 Feb. 8, 2024

(51) Int. Cl.
C23C 16/40 (2006.01)
C23C 16/455 (2006.01)

(52) U.S. Cl.
CPC ...... *C23C 16/405* (2013.01); *C23C 16/45529* (2013.01); *C23C 16/45553* (2013.01)

(58) Field of Classification Search
None
See application file for complete search history.

(56) References Cited

U.S. PATENT DOCUMENTS

2019/0309413 A1* 10/2019 Wu ................. C30B 29/16
2020/0181771 A1* 6/2020 Wu ................. C23C 16/45555

* cited by examiner

*Primary Examiner* — Mandy C Louie
(74) *Attorney, Agent, or Firm* — Kilpatrick Townsend & Stockton LLP

(57) ABSTRACT

A method includes forming a first coating comprising amorphous rare earth metal-containing oxide on a surface of an article using a first atomic layer deposition (ALD) process that includes repeating a process of alumina deposition cycles followed by rare earth metal oxide deposition cycles N1 times. The method also includes forming a second coating comprising crystalline rare earth metal oxide on the first coating using a second ALD process. The method also includes forming a third coating comprising amorphous rare earth metal-containing oxide on the second coating using a third ALD process that includes repeating a process of alumina deposition cycles followed by rare earth metal oxide deposition cycles N2 times. The method also includes forming a fourth coating comprising crystalline rare earth metal oxide on the third coating using a fourth ALD process. In some embodiments, a ratio of N1 to N2 is between about 100 and about 150.

20 Claims, 14 Drawing Sheets

MULTILAYER ALD COATING FOR CRITICAL COMPONENTS IN PROCESS CHAMBER

BACKGROUND

The present invention relates, most generally, to semiconductor device manufacturing. More particularly, the present invention relates to semiconductor manufacturing tools and methods and systems.

Plasma etching operations are used extensively in semiconductor device manufacturing. Various processing operations involve RIE (reactive ion etching) or other plasma etching operations to etch materials formed on a semiconductor device, typically to create a pattern in a material layer formed on a semiconductor substrate. Plasma cleaning operations are also commonly used in the semiconductor device manufacturing industry and in conjunction with various materials used in semiconductor device manufacturing. Etching and cleaning operations may, for example, include stripping operations used to remove a blanket film of material from a semiconductor device. Plasma processing operations often involve the plasma reaction to remove a material formed on a substrate. Such plasma processing operations often involve the use of fluorine-based gases, chlorine-based gases, hydrogen-based gases, etc.

As device feature sizes continue to decrease, and fabrication process requirements become more stringent, plasma process equipment and operation are facing many challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
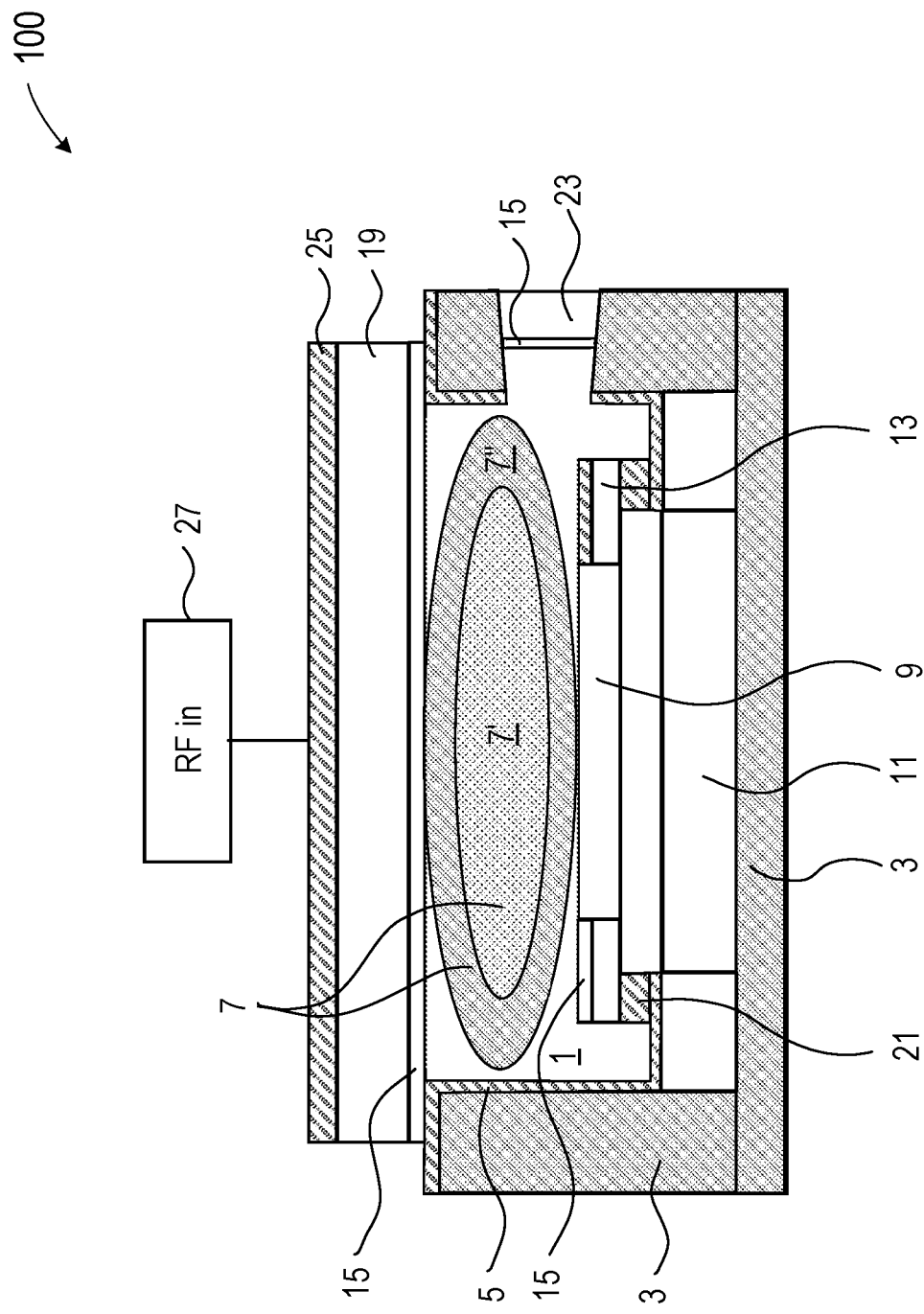
FIG. 1 is a cross-sectional view showing an exemplary plasma etching process chamber, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Within a plasma processing chamber are various articles, including a process kit, i.e., the quartz or other ceramic or insulating hardware typically included within a plasma processing chamber and which influences the impedance of the chamber. The process kit typically includes a focus ring, one or more windows, and a large plate above the plasma or various other components, and therefore constitutes a significant amount of surface area within the process chamber. The materials typically used for process kits are prone to attack and degradation in the various chemistries. Such materials that are prone to attack include quartz, silicon, alumina, and anodized parts, and as a result, these parts have short lifetimes and require frequent and lengthy conditioning of the process chambers within which they are used. Quartz, for example, is a favored material for process kits but is subject to erosion and degradation in etching and cleaning chemistries. As the quartz process kit erodes, it causes particle contamination, it alters the impedance of the chamber and therefore the plasma performance, and it needs to be replaced. As such, some process kits are oxidized or coated with a material such as a ceramic to improve the integrity of the process kit in the plasma chemistry. By coating the exposed surfaces of the process kit with materials other than designed by the manufacturer, however, the impedance of the process chamber is changed and therefore the etch characteristics and cleaning characteristics of the tool are compromised, i.e., process shifting occurs. Moreover, existing coatings are subject to cracking, peeling, and delamination which produce particle contamination.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Semiconductor process chamber critical component is very important to wafer performance. Chamber component short lifetime problem also exists in current semiconductor equipment chambers due to limitations of component material and/or surface. Coating the surface of these components is one approach to modify the surface properties to improve chamber performance, especially for particle/defect issue, trace metal issue, plasma distribution, etc. Existing coating techniques are not satisfactory. For example, the plasma sprayed approach cannot make dense coatings. Aerosol deposition and PVD/CVD coating can be dense, but not conformal and cannot coat complicated surfaces. Anodization can only convert the surface to oxide layer, and the converted coating is porous and prone to cracking. Further, a coating of single crystalline layer cannot have strong adhesive to the substrate. On the other hand, an amorphous coating cannot have a good ion bombardment resistance.

Some embodiments of this disclosure are directed to a rare earth metal-containing oxide coating structure formed by atomic layer deposition (ALD), that includes a coating of single amorphous layer on the substrate surface overlaid with a multilayer coating that includes alternating crystalline layers interleaved by thin amorphous layers. Formed by atomic layer deposition (ALD), the multilayer top coating structure with top multiple crystalline layers interrupted by thin amorphous layers provides a smooth top coating surface. The amorphous bottom coating provides strong adhesion to the substrate. The protective coating is conformal, even for complicated shape and high aspect ratio shapes.

In some embodiments, the bottom amorphous layer has an yttrium aluminate composition, with a flexible mechanical property and provides a great adhesive strength with the substrate. In the top multilayered coating, thin amorphous yttrium aluminate layer between crystalline yttria layer plays a role to interrupt the yttria crystal growth and form a crystalline layer without grain preferred orientation growth with small grain size and a smooth surface. In some embodiments, the top crystalline layer of yttria, with cubic crystal structure and small grain size, exhibits a higher hardness and shows excellent ion bombardment resistance and radical erosion resistance. As used herein, yttria refers to yttrium oxide, $Y_2O_3$. Yttrium aluminate ($Y_3Al_5O_{12}$) is also known as yttrium aluminum garnet (YAG), which is a refractory, hard oxide ceramic that does not damage easily.

Some embodiments of this disclosure are related to a protective coating of rare earth-containing oxides formed using atomic layer deposition (ALD) on surfaces of an article for a semiconductor process system, for example, a process kit inside a plasma processing chamber that may be used for plasma etching, plasma cleaning, or both. The plasma processing chamber may be a chamber in any of various plasma processing apparatuses made by various manufacturers that are commercially available and used in the semiconductor manufacturing industry. The plasma processing chamber may be a chamber that is primarily used for etching processes or cleaning processes and the processing chamber may be a chamber dedicated to a fluorine-based processing chemistry. As used herein, the article or process kit refers to the insulating components of the process chamber apparatus that are capable of reducing or eliminating electrical arcing from exposed metal in the chamber. The process kit may include various components such as an insulating plate, a focus ring, and one or more windows that enable a viewer to see inside the process chamber. The article or process kit may be formed of various suitable materials such as insulating materials including but not limited to quartz and various ceramics.

FIG. 1 is a cross-sectional view showing an exemplary plasma etching process chamber, in accordance with some embodiments. FIG. 1 shows process chamber 1 disposed within chamber body 3. Chamber body 3 may be formed of various suitable sturdy materials of high strength. Chamber liner 5 is also formed of various suitable materials available in the art of semiconductor processing apparatuses. The process chamber liner 5 may be formed of aluminum or other suitable materials and may include protective coatings on process chamber liner 5 that forms the internal walls of process chamber 1, may be used.

Process chamber 1 may be used for various applications such as various plasma processing operations including but not limited to etching, stripping, and cleaning. Plasma 7 including concentrated high-intensity plasma area 7' and outer low-intensity plasma area 7" may be produced using various suitable plasma generating operations. The distribution and configuration of high-intensity plasma area 7' can be defined by tuning the pressure in process chamber 1 and therefore high-intensity plasma area 7' and low-intensity plasma area 7" may take on different relative configurations in other exemplary embodiments. According to one exemplary embodiment, the plasma processing operation may be a reactive ion etching (RIE) or plasma etching operation. Plasma 7 may be generated using conventional means. In the illustrated embodiment, the plasma generation may be effectuated by a potential difference between electrode 25 and chuck 9/pedestal 11. RF generating means 27 may be advantageously coupled to electrode 25 according to one exemplary embodiment. In other exemplary embodiments, a coil (not shown) may be used in place of electrode 25.

Chuck 9 may be any of various suitable chucks for retaining a substrate as used in the semiconductor manufacturing industry and in one exemplary embodiment, chuck 9 may be an electrostatic chuck. Pedestal 11 may be formed of various suitable materials. Various conventional means (not shown) may be used to deliver gases to process chamber 1 for use in the plasma to be generated in process chamber 1. Various combinations of gases may be used. According to one exemplary embodiment, process chamber 1 may be utilized for etching or removing silicon, e.g., polysilicon etching, and included among the plasma processing gases may be fluorine-based, chlorine-based, and hydrogen-based etching/cleaning gases. The etching chemistries may include various other carrier and/or reactive gases along with the etching species in other exemplary embodiments.

In the illustrated embodiment, the process kit includes quartz plate 19, focus ring 13 and window 23. Quartz plate 14 is seen to be generally parallel to the upper surface of chuck 9 but other configurations may be used in other exemplary embodiments. In the illustrated embodiment, the process kit may be a quartz process kit but process kits formed of other materials may also be used. Focus ring 13 rests on ceramic base ring 21 and the edge of chuck 9. In each of the components of the process kit, thin film coating 15 is disposed on the surface of the process kit component that is exposed to the plasma. Coating 15 is formed on the respective surfaces of the process kit components as a thin film coating using another coating apparatus and advantageously prior to the installation of the process kit within process chamber 1. The coating apparatus used to form coating 15 is an atomic layer deposition (ALD) apparatus sized to accommodate the various components of the process kit. Coating 15 is a thin film coating and may have a thickness about 20 µm according to one exemplary embodiment but other thicknesses may be used in other exemplary embodiments. In one exemplary embodiment, coating 15 may include thickness of 5 microns. In one exemplary embodiment, coating 15 may be a yttria, i.e., $Y_2O_3$ coating.

Coating 15 is resistant to attack from the etch or cleaning chemistries used in plasma 7. In one exemplary embodiment, $Y_2O_3$ coating 15 is resistant to attack from fluorine-based, chlorine-based, hydrogen-based, chemistries, etc. Coating 15 also provides the advantages of prolonging the lifetime of the process kit, e.g., window 23, focus ring 13 and quartz plate 19. The apparatus with process chamber 1 is used to carry out various etching and cleaning plasma operations. Because coating 15 is resistant to attack/degradation in the etching plasma, particle defect levels are reduced and the time needed for conditioning process chamber 1 after a chamber clean, for example, is reduced. Due to the material and the thin film nature of coating the overall impedance of process chamber 1 is maintained and little or no process shift is experienced, i.e., the plasma etching and plasma cleaning characteristics are uniform throughout a run and repeatable on a run-to-run basis and the processing chamber performs according to design and according to designs with uncoated process kit designed to be used within the chamber.

Figure 2:
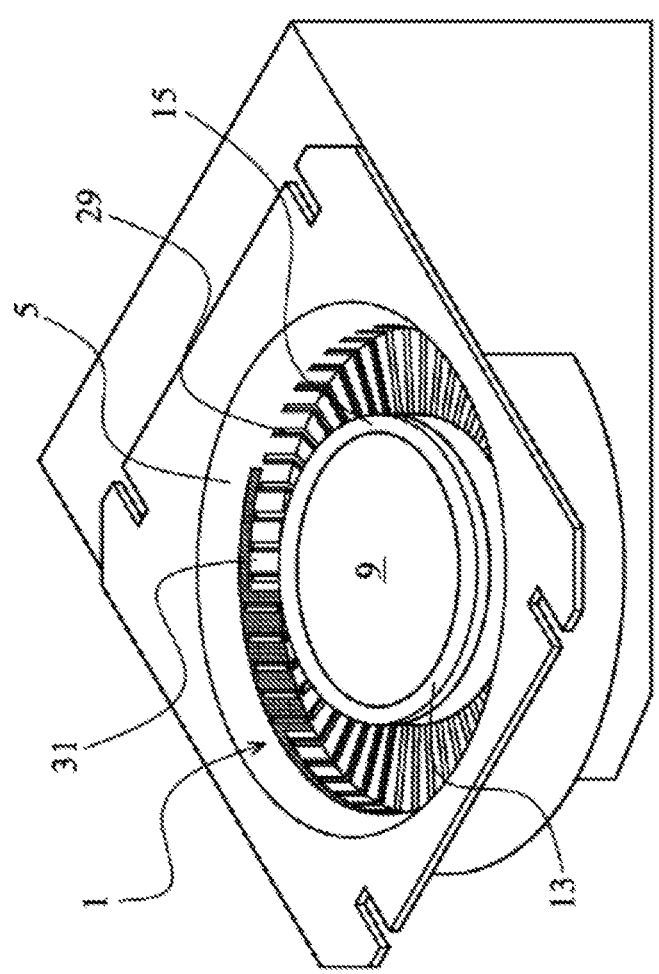
FIG. 2 is a perspective, top view of an exemplary process chamber, in accordance with some embodiments.

FIG. 2 is a perspective, top view of an exemplary process chamber, in accordance with some embodiments. Liner 5 serves as a baffle as the bottom portion of liner 5 consists of ribs 31 and gaps 29 in between the ribs that may be used to maintain a uniformity in gas flow during pump down or processing. Focus ring 13 of the process kit laterally surrounds chuck 9 and is coated with coating 15, as are other exposed surfaces of the process kit (not shown in FIG. 2).

Figure 3:
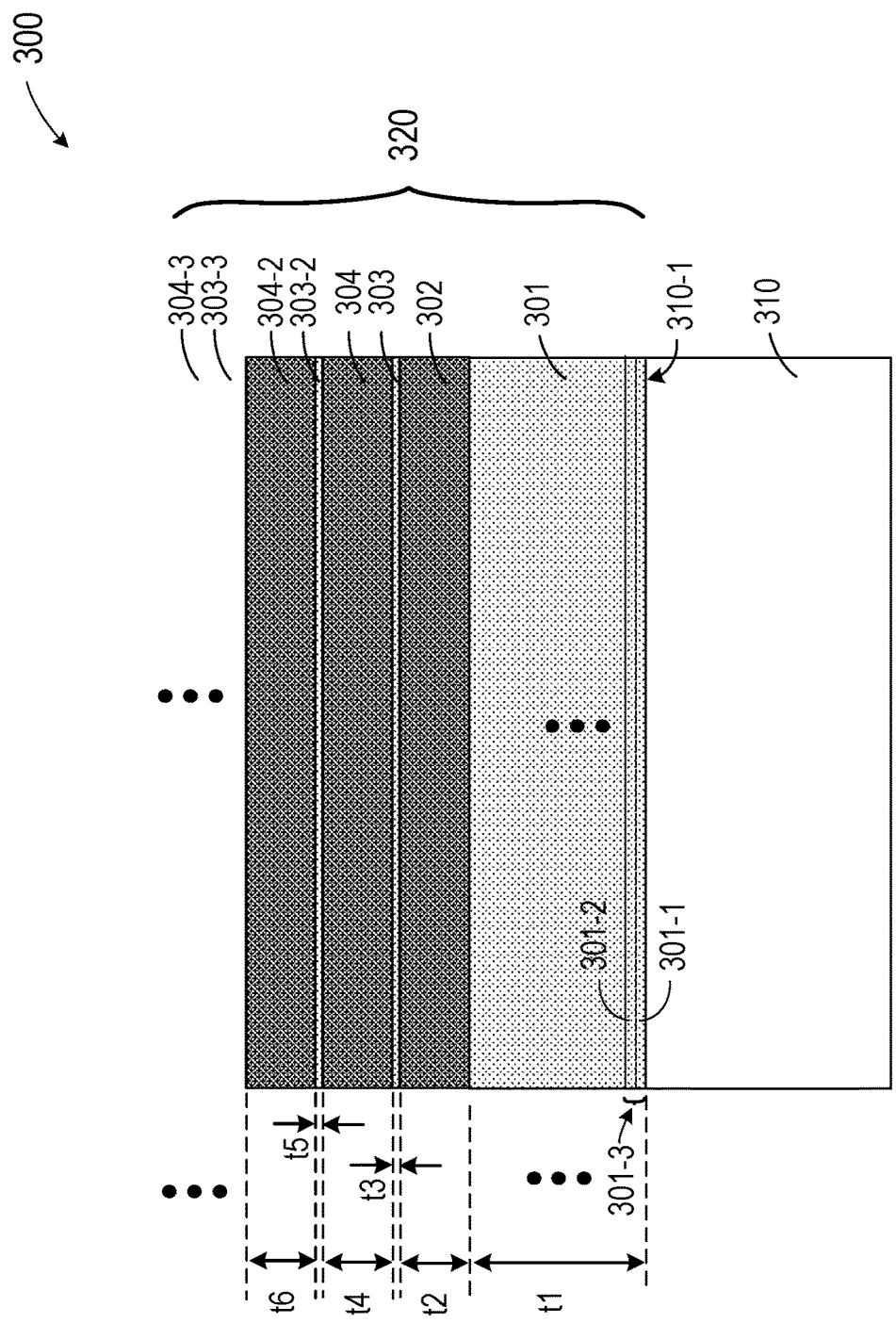
FIG. 3 is a cross-sectional view showing an exemplary of a protective coating on an article for semiconductor processing, in accordance with some embodiments.

FIG. 3 is a cross-sectional view showing an exemplary protective coating on an article for semiconductor processing, in accordance with some embodiments. FIG. 3 illustrates a cross-sectional view of a portion of an article 300 including a protective coating 320 on a surface 310-1 of the article body 310. The protective coating 320 includes a first coating 301 on the surface 310-1 of the article body 310. In some embodiment, the first coating 301 includes amorphous rare earth metal-containing oxide formed by a first atomic layer deposition (ALD) process and characterized by a first thickness t1. The first coating 301 includes a first number (N1) of layers of a composite layer including an amorphous rare earth metal oxide layer 301-2 on an amorphous alumina layer 301-1, N1 being an integer. The protective coating 320 also includes a second coating 302 on the first coating 301. The second coating 302 includes crystalline rare earth metal oxide formed by a second atomic layer deposition (ALD) process and characterized by a second thickness t2.

In FIG. 3, the protective coating 320 also includes a third coating 303 on the second coating 302. The third coating 303 includes amorphous rare earth metal-containing oxide formed by a third atomic layer deposition (ALD) process and characterized by a third thickness t3. The third coating 303 includes a second number (N2) of layers of a composite layer including an amorphous rare earth metal oxide layer on an amorphous alumina layer (not shown in FIG. 3), N2 being an integer. In some embodiments, the composite layer in the third coating is similar to composite layer 301-3 in the first coating and includes an amorphous rare earth metal oxide layer 301-2 on an amorphous alumina layer 301-1. The protective coating 320 also includes a fourth coating 304 on the third coating 303. The fourth coating 304 includes crystalline rare earth metal oxide formed by a fourth atomic layer deposition (ALD) process and characterized by a fourth thickness t4.

In some embodiments, the protective coating 320 further includes additional coatings formed repeating the third atomic layer deposition (ALD) process and fourth atomic layer deposition (ALD) process to repeatedly forming additional third coating and additional fourth coating until a sum of all coatings reach a target thickness. For example, FIG. 3 shows additional third coating 303-2 and fourth coating 304-2, and, further, third coating 303-3 and fourth coating 304-3.

In some embodiments, a total number of coatings comprising the crystalline rare earth metal oxide, such as coatings 302 and 304, is between about 2 to about 100.

In some embodiments, a ratio of the first number (N1) of layers to the second number (N2) of layers is between about 100 and about 150, and a ratio of the first thickness to the third thickness is between about 100 and about 150.

In some embodiments, in the first atomic layer deposition (ALD) process comprises the first number of repetitions of three cycles of alumina deposition followed by two cycles of rare earth metal oxide deposition to reach the first thickness.

In some embodiments, a total thickness of coatings including crystalline rare metal oxide is between about 50 nm to about 500 nm.

In some embodiments, a thickness of the first coating including amorphous yttrium aluminate is between about 10 nm to about 500 nm.

In some embodiments, a method for fabricating a semiconductor device includes plasma processing in one or more etching process chambers that include a coating as described in FIG. 3. The method includes forming fin structures on a substrate. In some embodiments, such as in methods for forming fin field-effect transistor (FinFET) devices, the fin structures are fin-shaped structures etched in the semiconductor substrate. In some structures, such as in methods for forming gate-all-around (GAA) devices, the fin structures are etched in stacked semiconductor layers. In either case, the etching processes include plasma etch or reactive ion etch (ME) in an etch system that includes components and/or process kits that have a coating, such as protective coating 320 described above in connection to FIG. 3. Examples of process kits in a plasma etch chamber includes a focus ring, one or more windows, and a large plate above the plasma, a base plate below the wafer, or various other components.

With reference to FIG. 3, in some embodiments, the coating is a multi-layered coating. A first coating 301 is an amorphous rare earth metal-containing oxide formed by a first atomic layer deposition (ALD) process and comprising a first number of layers of a composite layer including an amorphous rare earth metal-containing oxide layer 301-2 on an amorphous alumina layer 301-1. A second coating 302 includes a crystalline rare earth metal-containing oxide formed by a second atomic layer deposition (ALD) process. A third coating includes amorphous rare earth metal-containing oxide formed by a third atomic layer deposition (ALD) process and includes a second number of layers of a composite layer including an amorphous rare earth metal-containing oxide layer on an amorphous alumina layer. A fourth coating 304 includes crystalline rare earth metal-containing oxide formed by a fourth atomic layer deposition (ALD) process.

In some embodiments, the method for fabricating the semiconductor device also includes forming isolation structures, for example, shallow trench isolation (STI). Forming the isolation structures can include etching trenches, filling the trenches with insulating materials, and removing excess insulating materials. The method can also include forming gate structures, forming contacts and vias structures, forming interconnect structures, which all involve one or more etching processes. In some embodiments, the some or all the etching processes are carried out in an etch system that includes components and/or process kits that have a coating as described above.

Further details of the materials and properties of the coatings in FIG. 3 are described below.

Figure 4:
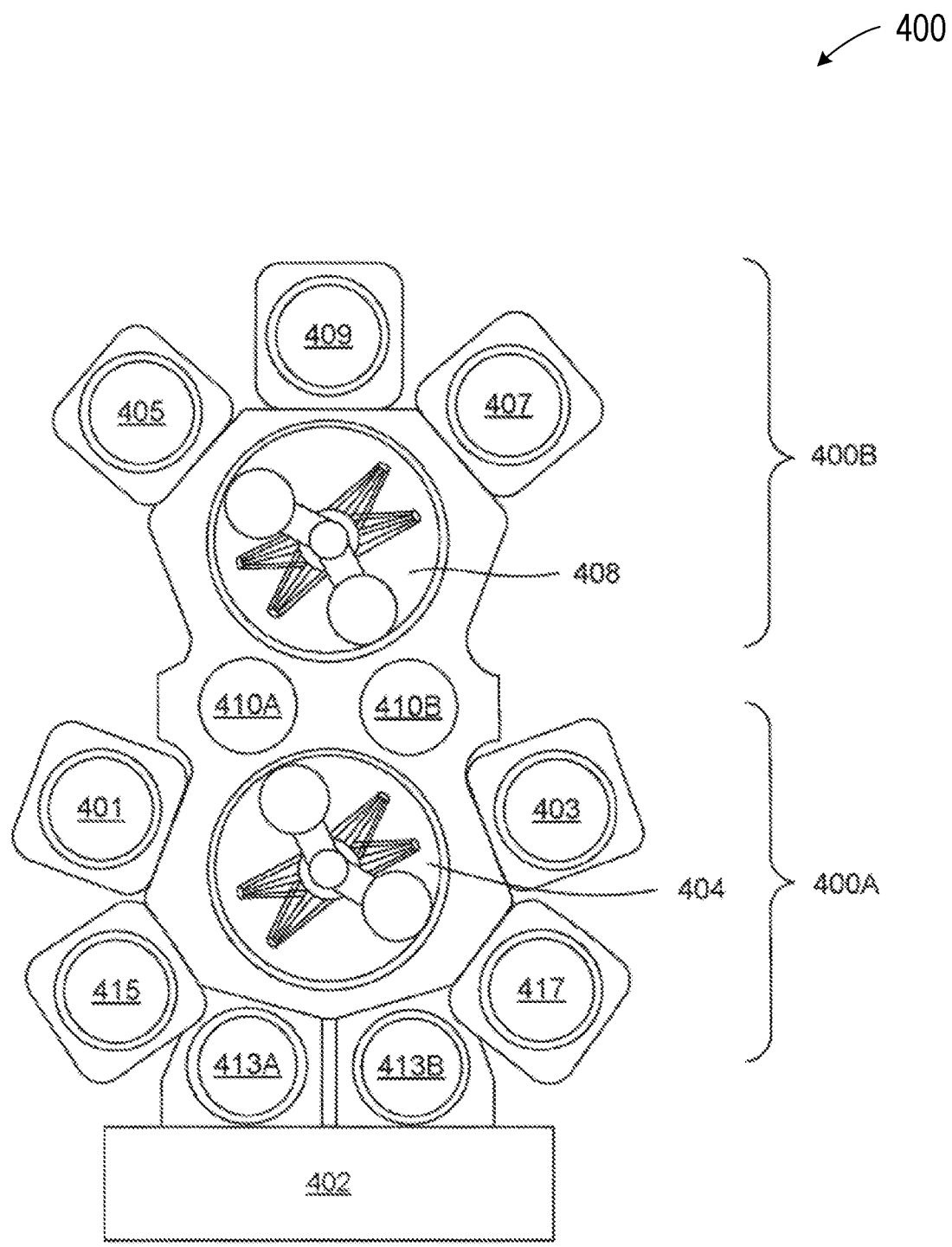
FIG. 4 top view that illustrates a configuration of a semiconductor wafer manufacturing system that can be used in implementing the atomic layer deposition (ALD) process, in accordance with some embodiments.

FIG. 4 top schematic view that illustrates a configuration of a semiconductor wafer processing system that can be used in implementing the atomic layer deposition (ALD) process, in accordance with some embodiments. Referring to FIG. 4, a semiconductor wafer processing system 400 used to perform ALD processes for forming thin metal and metal oxide films for semiconductor wafers or other articles is illustrated. The semiconductor wafer processing system 400 has several growth chambers arranged in each of the two clusters 400A and 400B. Semiconductor wafer processing system 400 may also include other growth chambers for depositing dielectric layers, barrier layers, blocking layers, adhesion layers, anti-reflecting layers, and any other suitable layers. Each layer in the coating structures described above in FIG. 3 can be formed in semiconductor wafer processing system 400 without exposing the wafer to ambient contact between deposition processes.

Two load lock chambers 413A and 413B are configured to receive a wafer transferred from a load port 402. Load lock chambers 413A and 413B are vented to a pressure equivalent to the load port 402 while a wafer or an article is transferred between load port 402 and load lock chambers 413A or 413B. When moving the wafer or article from load lock chamber 413A or 413B into one of the chambers in semiconductor wafer processing system 400, load lock chambers 413A and 413B are pumped down to a certain degree of vacuum that is closer to the vacuum level inside the clusters 400A and 400B. Clusters 400A and 400B each has at least one mechanical means such as a robot arm 404 or 408 which transfers the wafer parked in the pumped-down load lock chamber 413A or 413B to one of the growth chambers. Semiconductor wafer processing system 400 can also include degassing chambers 415 and 417 that are used to activate and remove gaseous and/or liquid substances, such as moisture and oxygen from substrates to prevent change in thin film characteristics and cause deposition failure.

In some embodiments, semiconductor wafer processing system 400 includes multiple deposition chambers, such as 401, 403, 405, 407, and 409, for depositing different thin films for wafer processing or article coating. In some embodiments, chamber 401 can be configured for pre-deposition ozone ($O_3$) treatment. In some embodiments, deposition chamber 403 can be maintained at a temperature between room temperature and about 300° C. In some embodiments, deposition chamber 403 can be maintained at a temperature between about 200° C. and about 400° C.

In some embodiments, deposition chamber 403 can be an ALD deposition chamber for depositing the first coating layer 301 described above in connection to FIG. 3. Deposition chamber 403 is attached to cluster 400A and is connected to precursor supplies for amorphous yttrium aluminate formation. For example, each cycle of alumina deposition uses trimethylaluminium (TMA) as a precursor for alumina and H2O as an oxidation agent. Each cycle of yttria deposition uses yttrium (III) tris(methylcyclopentadienyl) (Y(MeCp)3) as a precursor for yttria and H2O as an oxidation agent.

In some embodiments, deposition chamber 403 can be maintained at a temperature between room temperature and about 300° C. In some embodiments, deposition chamber 403 can be maintained at a temperature between about 200° C. and about 400° C. In some embodiments, deposition chamber 403 can be maintained at a chamber pressure between about 1 Torr and about 20 Torr.

In some embodiments, deposition chamber 405 can be an ALD deposition chamber for depositing the second coating layer 302 described above in connection to FIG. 3. Deposition chamber 405 is attached to cluster 400B and is connected to precursor supplies for crystalline yttria formation. For example, each cycle of yttria deposition comprises using yttrium (III) tris(methylcyclopentadienyl) (Y(MeCp)3) as a precursor for yttria and H2O as an oxidation agent. In some embodiments, deposition chamber 405 can be maintained at a temperature between room temperature and about 300° C. In some embodiments, deposition chamber 403 can be maintained at a temperature between about 200° C. and about 400° C. In some embodiments, deposition chamber 403 can be maintained at a chamber pressure between about 1 Torr and about 20 Torr.

In some embodiments, deposition chamber 407 can be an ALD deposition chamber for depositing the third coating layer 303 described above in connection to FIG. 3. Deposition chamber 407 is attached to cluster 400B and is connected to precursor supplies for amorphous yttrium aluminate formation. For example, each cycle of alumina deposition uses TMA as a precursor for alumina and H2O as an oxidation agent. Each cycle of yttria deposition uses yttrium (III) tris(methylcyclopentadienyl) (Y(MeCp)3) as a precursor for yttria and H2O as an oxidation agent.

In some embodiments, deposition chamber 407 can be maintained at a temperature between room temperature and about 300° C. In some embodiments, deposition chamber 403 can be maintained at a temperature between about 200° C. and about 400° C. In some embodiments, deposition chamber 403 can be maintained at a chamber pressure between about 1 Torr and about 20 Torr.

In some embodiments, deposition chamber 409 can be an ALD deposition chamber for depositing the second coating layer 302 described above in connection to FIG. 3. Deposition chamber 409 is attached to cluster 400B and is connected to precursor supplies for crystalline yttria formation. For example, each cycle of yttria deposition comprises using yttrium (III) tris(methylcyclopentadienyl) (Y(MeCp)3) as a precursor for yttria and H2O as an oxidation agent. In some embodiments, deposition chamber 405 can be maintained at a temperature between room temperature and about 300° C. In some embodiments, deposition chamber 403 can be maintained at a temperature between about 200° C. and about 400° C. In some embodiments, deposition chamber 403 can be maintained at a chamber pressure between about 1 Torr and about 20 Torr.

The configuration of wafer processing system 400 described above is merely an example, and other arrangements can also be used. For example, in some embodiments, the first coating 301 and the third coating 303 can be formed in the same deposition chamber, for example, deposition 401. Similarly, in some embodiments, the second coating 302 and the four coating 304 can be formed in the same deposition chamber, for example, deposition 403.

In some embodiments, cooling chambers 410A and 410B allow a wafer to cool down to a desired temperature at an appropriate cooling rate in between various thin film growths without ambient contact. In some embodiments, additional chambers can be included in semiconductor wafer processing system 400 for depositing any suitable material used to form the coating structures described above in connection to FIG. 3.

During the deposition of various layers in the deposition chambers of semiconductor wafer processing system 400, the deposition chambers are kept under vacuum, such that no ambient contact or contamination is introduced. A user may enter a single recipe into a computer processor to control the deposition chamber for performing the multi-cycle deposition processes. For example, the recipe can include deposition parameters for the first and second precursors in the multi-cycle deposition process, such as pulsing time, purging time, gas flow rate, chamber temperature, chamber pressure, plasma power, substrate bias, and/or any suitable deposition parameters. Therefore, the entire deposition process for one or more layers can be controlled by a single recipe in the same chamber.

Each wafer or article is assigned with a sequence of operations according to an operating recipe to achieve automatic wafer processing in semiconductor wafer processing system 400. In some embodiments, a substrate or article is first transferred from load lock chamber 413A and/or 413B to cluster 400A using robot arm 404. The wafer or article can be sent into chamber 415 or 417 for degassing and then to various deposition chambers to form the coatings. The wafer can then be parked to load lock chambers 413A and 413B using robot arms 404 and 408. The vacuum level inside the load lock chambers chamber 413A and 413B are raised to a level comparable to load port 402, and the wafer is then transferred to load port 402 and taken out.

Figure 5:
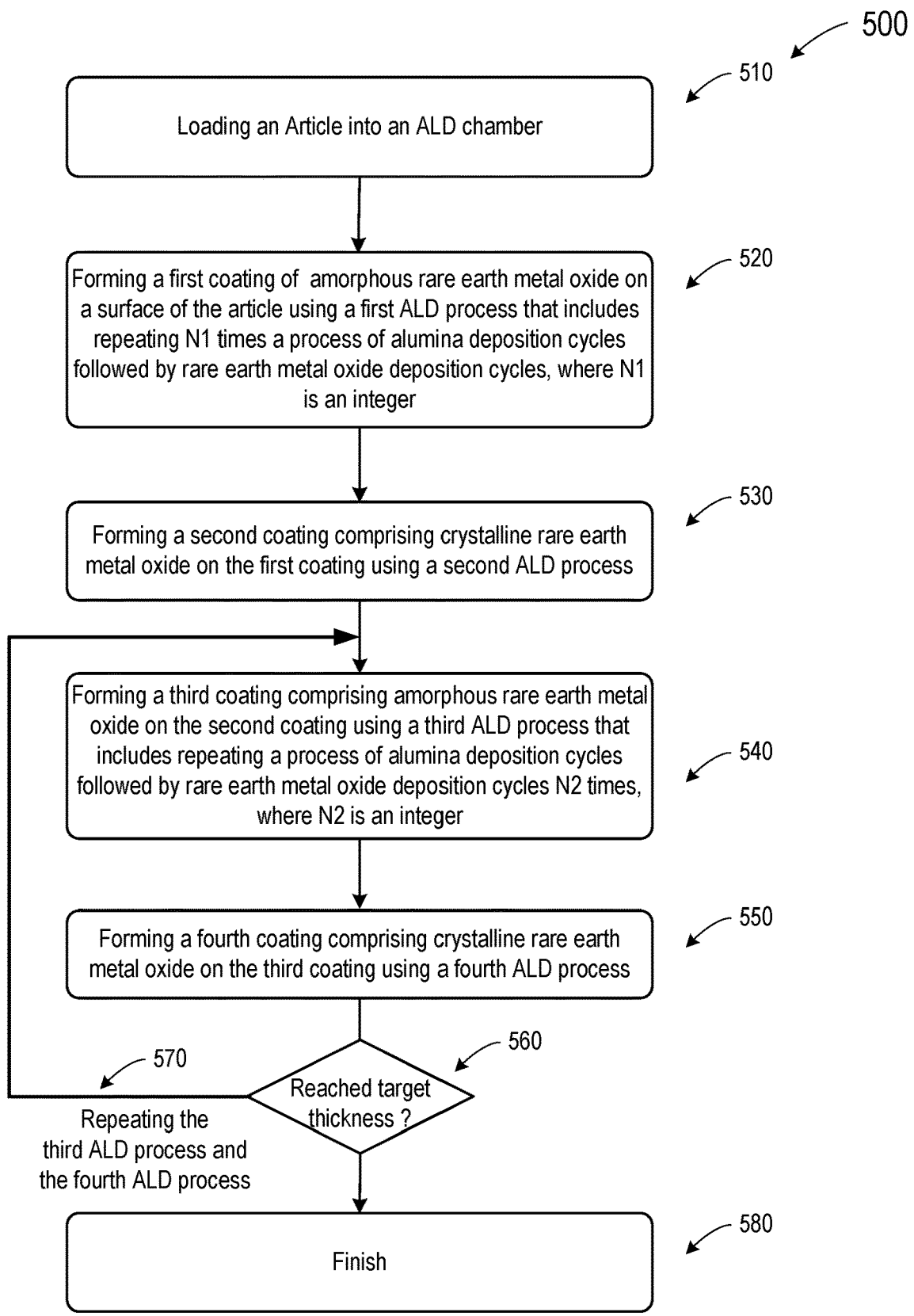
FIG. 5 is a flowchart illustrating a method for forming a coating on components in a semiconductor process chamber, in accordance with some embodiments.

FIG. 5 is a flowchart illustrating a method for forming a coating on an article for a semiconductor process chamber, in accordance with some embodiments. As shown in FIG. 5, a method 500 for forming a coating on an article can be summarized as follows and described further with reference to FIGS. 3, 4, and 6A-6G.

At 510—loading an article into an ALD deposition chamber;

At 520—forming a first coating 301 comprising amorphous rare earth metal-containing oxide on a surface of an article using a first atomic layer deposition (ALD) process that includes repeating a process of alumina deposition cycles followed by rare earth metal oxide deposition cycles N1 times, where N1 is an integer;

At 530—forming a second coating comprising crystalline rare earth metal oxide on the first coating using a second atomic layer deposition (ALD) process;

At 540—forming a third coating comprising amorphous rare earth metal-containing oxide on the second coating using a third atomic layer deposition (ALD) process that includes repeating a process of alumina deposition cycles followed by rare earth metal oxide deposition cycles N2 times, where N2 is an integer;

At 550—forming a fourth coating comprising crystalline rare earth metal oxide on the third coating using a fourth atomic layer deposition (ALD) process;

At 560—Determining whether a target thickness of coating is reached;

At 570—If no, repeating the third atomic layer deposition (ALD) process and fourth atomic layer deposition (ALD) process to repeatedly forming additional third coating and additional fourth coating until a sum of all coatings reaches a target thickness;

At 580—If yes. Finish.

FIGS. 6A-6G are cross-sectional view diagrams illustrating a method for forming a coating on components in a semiconductor process chamber, in accordance with some embodiments. Method 500 outlined in the flowchart in FIG. 5 for forming a protective coating on an article for a semiconductor process chamber is described below with reference to FIGS. 6A-6G.

Figure 6A:
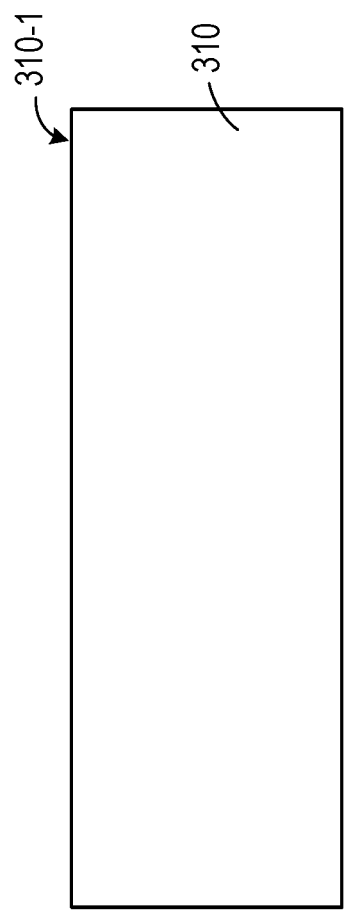
FIGS. 6A-6G are cross-sectional view diagrams illustrating a method for forming a coating on components in a semiconductor process chamber, in accordance with some embodiments.

At 510, method 500 includes loading an article into an ALD deposition chamber. An example of a semiconductor processing system 400 that includes ALD deposition chambers is described above in connection with FIG. 4. FIG. 6A shows a top portion of an article 310, which has a top surface 310-1. The article 310 can be a component in or used in a semiconductor processing chamber that is subject to harsh processing conditions including plasma, high energy bombardment, reactive ions, and high temperature, etc. In some embodiments, the article can be a component to be used in assembling a plasma process chamber, such as discussed above in connection to FIGS. 1-2. In some embodiments, method 500 can include a pre-deposition ozone ($O_3$) treatment at, for example, a temperature between room temperature and about 300° C.

Figure 6B:
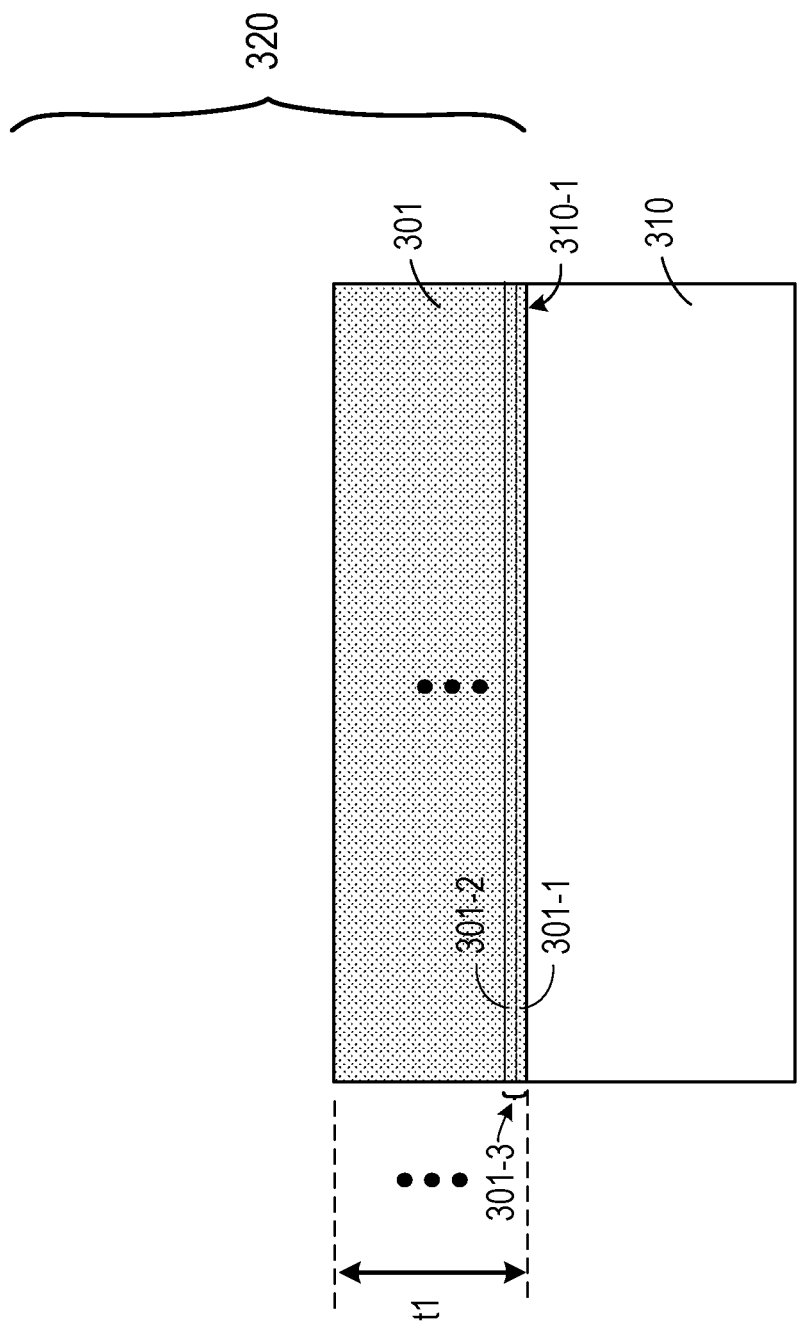

At 520, method 500 includes forming a first coating 301 comprising amorphous rare earth metal-containing oxide on a surface 310-1 of the article 310 using a first atomic layer deposition (ALD) process that includes repeating a process of alumina deposition cycles followed by rare earth metal oxide deposition cycles N1 times, where N1 is an integer, as shown in FIG. 6B.

In some embodiments, the rare earth metal oxide are selected from the group consisting of yttrium oxide ($Y_2O_3$), lanthanum oxide ($La_2O_3$), cerium oxide ($Ce_2O_3$), praseodymium oxide ($Pr_2O_3$), neodymium oxide ($Nd_2O_3$), samarium oxide ($Sm_2O_3$), europium oxide ($Eu_2O_3$), gadolinium oxide ($Gd_2O_3$), terbium oxide ($Tb_4O_7$), dysprosium oxide ($Dy_2O_3$), holmium oxide ($Ho_2O_3$), erbium oxide ($Er_2O_3$), ytterbium oxide ($Yb_2O_3$), Lutetium ($Lu_2O_3$), Scandium ($Sc_2O_3$), thulium oxide ($Tm_2O_3$), and mixtures thereof.

In some embodiments, the amorphous rare earth metal-containing oxide is amorphous yttrium aluminate. In these embodiments, the first coating 301 includes amorphous yttrium aluminate and characterized by a first thickness t1. The first ALD process includes a first number N1 of repetitions of three cycles of alumina deposition 301-1 followed by two cycles of yttria deposition 301-2 to reach the first thickness t1. For amorphous yttrium aluminate formation, each cycle of alumina deposition uses TMA as a precursor for alumina and H2O as an oxidation agent. Each cycle of yttria deposition uses yttrium (III) tris(methylcyclopentadienyl) (Y(MeCp)3) as a precursor for yttria and H2O as an oxidation agent. In some embodiments, the ALD deposition chamber can be maintained at a temperature between room temperature and about 300° C. In some embodiments, the deposition chamber can be maintained at a temperature between about 200° C. and about 400° C. In some embodiments, deposition chamber can be maintained at a chamber pressure between about 1 Torr and about 20 Torr.

Prior to introduction of a new precursor or reactant, the ALD chamber may be purged with an inert gas (such as nitrogen or argon) to remove any unreacted precursor and/or surface-precursor reaction byproducts. The precursors may be different for each layer. In some embodiments, the surface reactions may be done through co-deposition, i.e., where at least two precursors are used, in some embodiments at least three precursors are used and in yet further embodiments at least four precursors are used.

The ALD processes may be conducted at various temperatures depending on the type of process. In various embodiments, the ALD temperature windows may range from about 100° C. to about 400° C. In some embodiments, the ALD temperature window is between about 120-300° C.

In some embodiments, the first number of repetitions N1 of amorphous yttrium aluminate deposition is in a range of 400 to 800 cycles. The thickness of the first coating 301 is in a range of 10 nm to 500 nm. Depending on the application, the number of ALD cycles and the thickness of the coating film can vary.

Figure 6C:
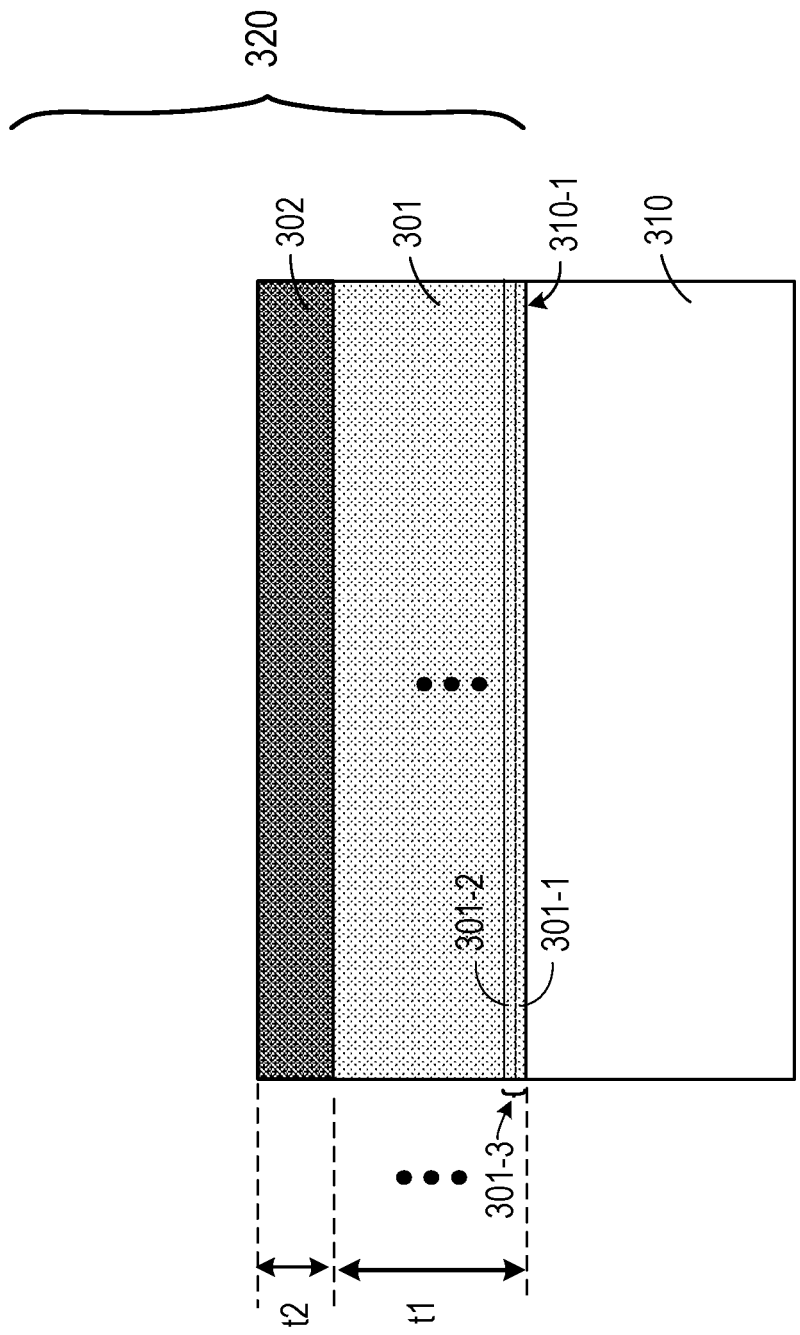

At 530, as shown in FIG. 6C, the method 500 includes forming a second coating 302 comprising crystalline rare earth metal oxide on the first coating using a second atomic layer deposition (ALD) process. In some embodiments, the second coating 302 includes crystalline yttria and is characterized by a second thickness t2. For crystalline yttria formation, each cycle of yttria deposition comprises using yttrium (III) tris(methylcyclopentadienyl) (Y(MeCp)3) as a precursor for yttria and H2O as an oxidation agent. In some embodiments, the deposition chamber 405 can be maintained at a temperature between room temperature and about 300° C. In some embodiments, deposition chamber can be maintained at a temperature between about 200° C. and about 400° C. In some embodiments, the deposition chamber can be maintained at a chamber pressure between about 1 Torr and about 20 Torr.

In some embodiments, the second atomic layer deposition (ALD) process includes about 300 to 600 cycles of yttria deposition. In some embodiments, the second coating 302 is characterized by a second thickness of 50 nm to 500 nm. Depending on the application, the number of ALD cycles and the thickness of the coating film can vary.

Figure 6D:
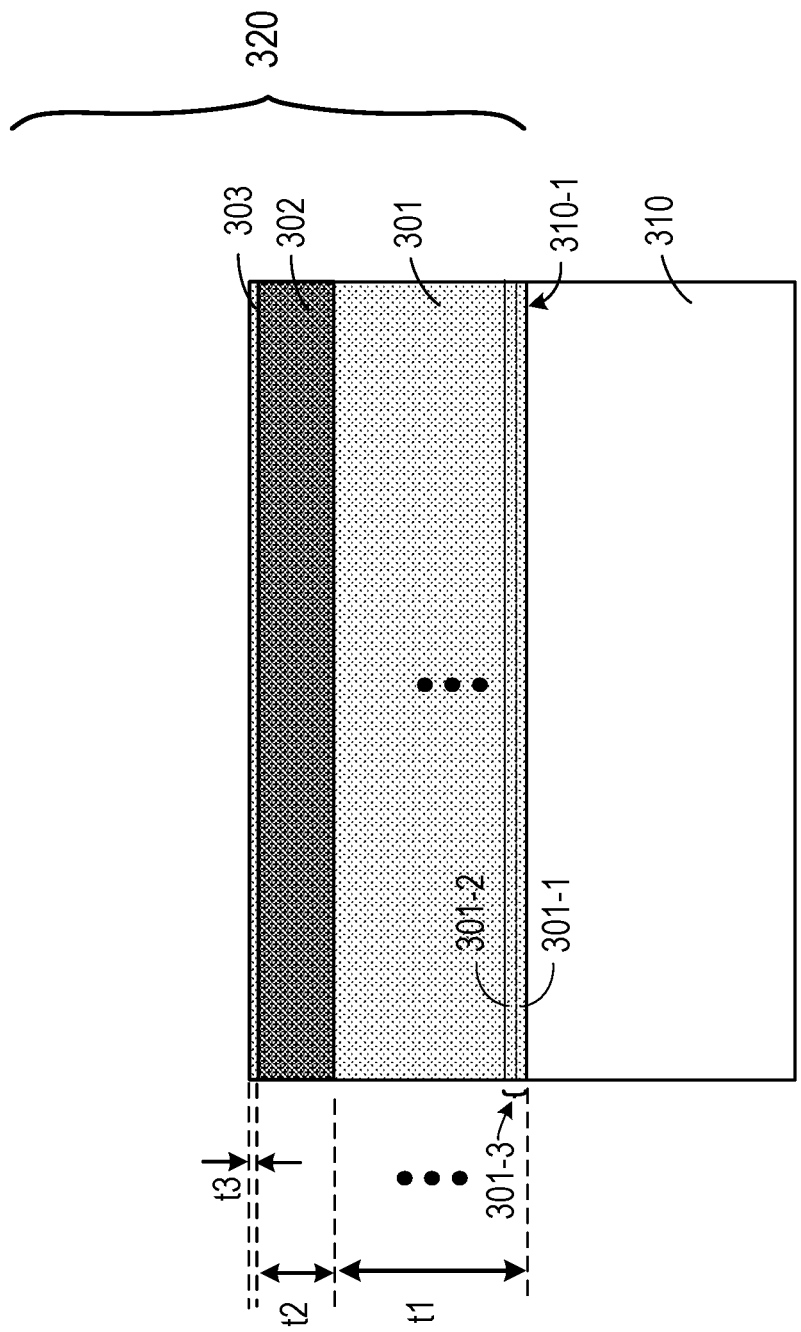

At 540, as shown in FIG. 6D, method 500 includes forming a third coating 303 comprising amorphous rare earth metal-containing oxide on the second coating using a third atomic layer deposition (ALD) process that includes repeating a process of alumina deposition cycles followed by rare earth metal oxide deposition cycles N2 times, where N2 is an integer. In some embodiments, the third coating 303 includes amorphous yttrium aluminate and characterized by a third thickness t3. The third ALD process comprising a second number of repetitions N2 of three cycles of alumina deposition followed by two cycles of yttria deposition to reach the third thickness t3. For amorphous yttrium aluminate formation, each cycle of alumina deposition uses TMA as a precursor for alumina and H2O as an oxidation agent. Each cycle of yttria deposition uses yttrium (III) tris(methylcyclopentadienyl) (Y(MeCp)3) as a precursor for yttria and H2O as an oxidation agent. In some embodiments, the ALD deposition chamber can be maintained at a temperature between room temperature and about 300° C. In some embodiments, the deposition chamber can be maintained at a temperature between about 200° C. and about 400° C. In some embodiments, deposition chamber can be maintained at a chamber pressure between about 1 Torr and about 20 Torr.

In some embodiments, a ratio of the first number of repetitions N1 to the second number of repetitions N2 is between about 100 and about 150. In some embodiments, a ratio of the first thickness t1 to the third thickness t3 is between about 100 and about 150.

In some embodiments, the second number of repetitions N2 of amorphous yttrium aluminate deposition is in a range of 2 to 8 cycles. The thickness of the third coating 303 is in a range of 1 nm to 5 nm. Depending on the application, the number of ALD cycles and the thickness of the coating film can vary.

Figure 6E:
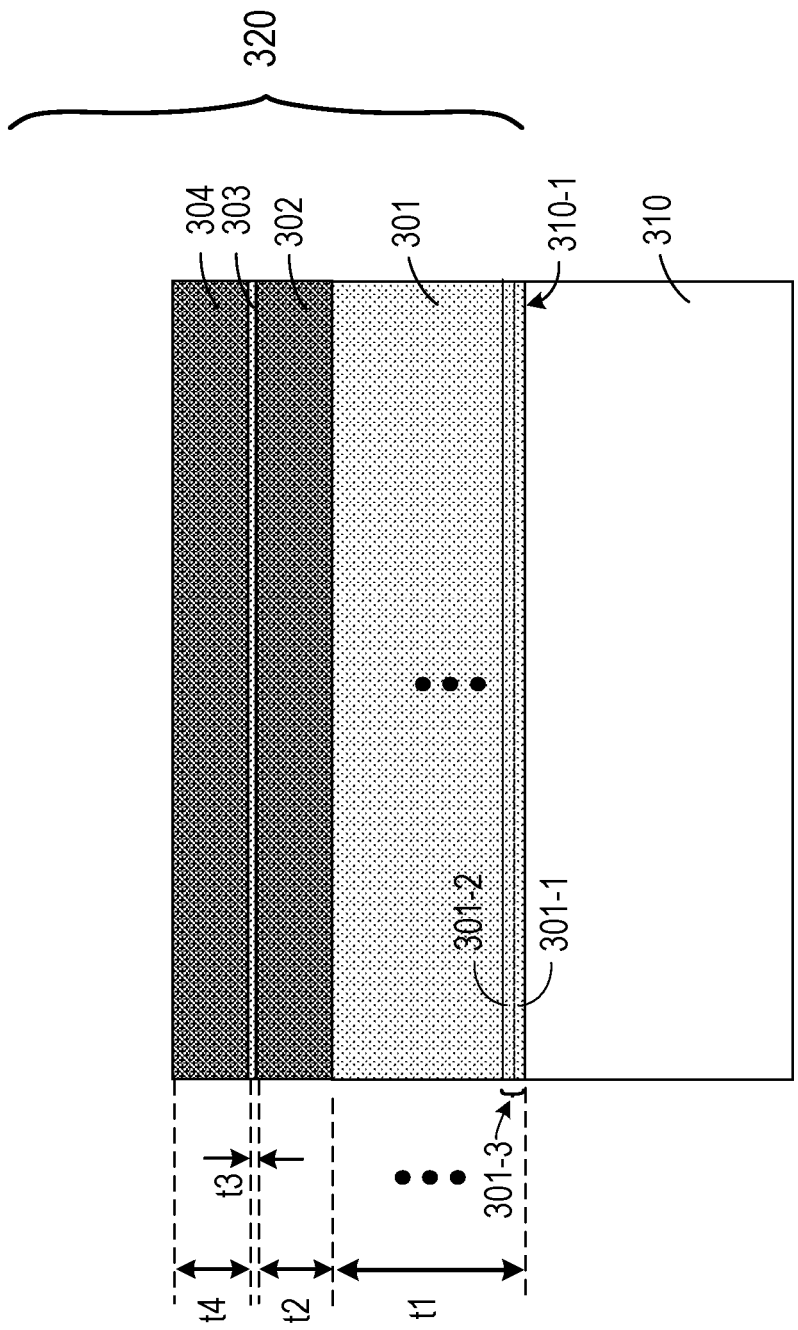

As shown in FIG. 6E, method 500 includes, at 550, forming a fourth coating 304 comprising crystalline rare earth metal oxide on the third coating 303 using a fourth atomic layer deposition (ALD) process. In some embodiments, the fourth coating 304 includes crystalline yttria and is characterized by a fourth thickness t4. For crystalline yttria formation, each cycle of yttria deposition comprises using yttrium (III) tris(methylcyclopentadienyl) (Y(MeCp)3) as a precursor for yttria and H2O as an oxidation agent. In some embodiments, the deposition chamber 405 can be maintained at a temperature between room temperature and about 300° C. In some embodiments, deposition chamber can be maintained at a temperature between about 200° C. and about 400° C. In some embodiments, the deposition chamber can be maintained at a chamber pressure between about 1 Torr and about 20 Torr.

In some embodiments, the fourth atomic layer deposition (ALD) process is similar to the second ALD process. For example, in some embodiments, the fourth atomic layer deposition (ALD) process includes about 300 to 600 cycles of yttria deposition. In some embodiments, the fourth coating 304 is characterized by a second thickness of 50 nm to 500 nm. Depending on the application, the number of ALD cycles and the thickness of the coating film can vary. For example, the fourth atomic layer deposition (ALD) process can be different from the second ALD process.

At 560, the method 500 includes determining whether a target thickness of coating is reached. If it is determined that a target thickness of all the coatings has been reached, the method finishes at 580. Otherwise, the method proceeds to 570 to form additional coatings.

Figure 6F:
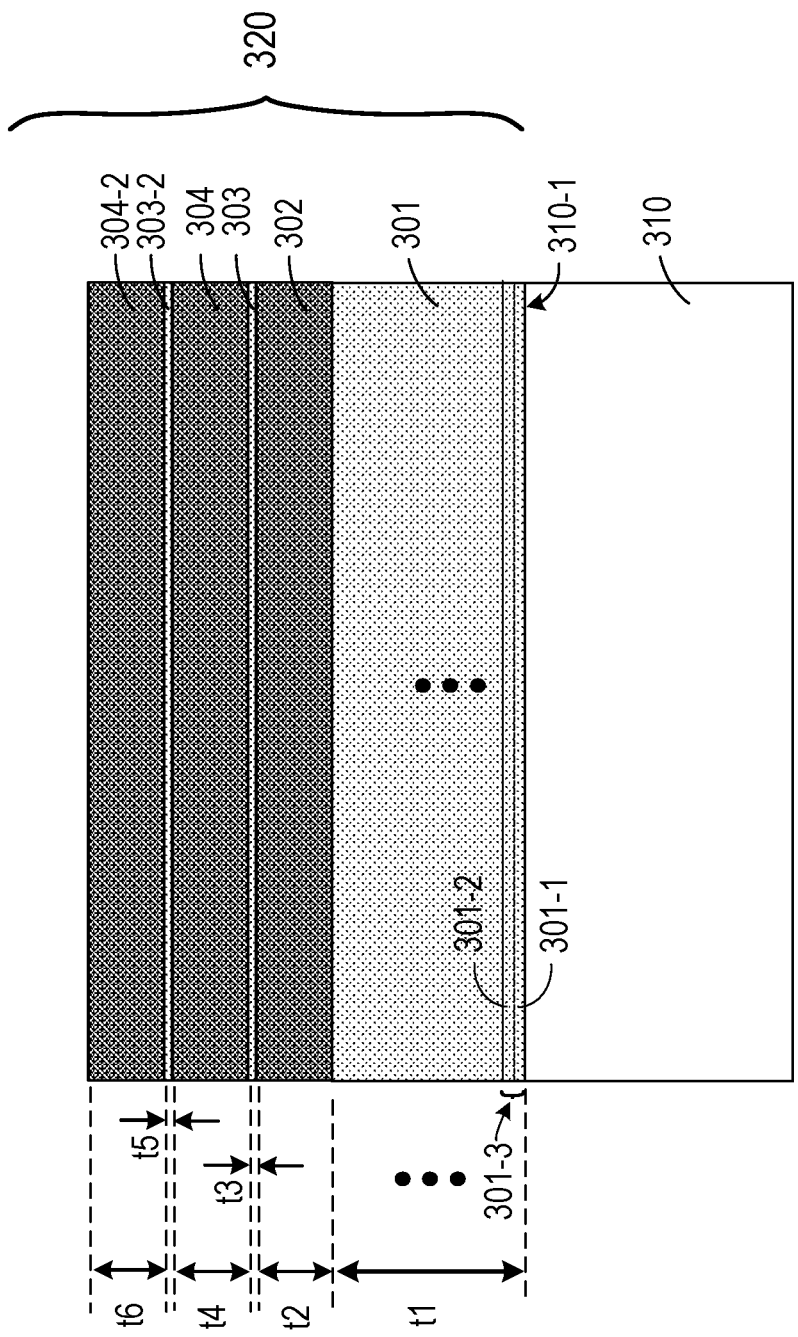

At 570, as shown in FIG. 6F, method 500 includes, repeating the third atomic layer deposition (ALD) process and fourth atomic layer deposition (ALD) process to repeatedly forming additional third coating 303-2 and additional fourth coating 304-2 until a sum of all coatings reaches a target thickness. In FIG. 6F, an additional third coating is shown as 303-2 and an additional fourth coating is shown as 304-2.

In some embodiments, the additional third coating 303-2 is similar to the third coating 303 and includes amorphous rare earth metal-containing oxide characterized by a third thickness t3. Similarly, in some embodiments, the additional fourth coating 304-2 is similar to the fourth coating 304 and includes crystalline rare earth metal oxide and characterized by a fourth thickness t4. The additional third coating 303-2 and the additional fourth coating 304-2 can be formed using similar processes described above in connection to the third coating 303 and the fourth coating 304. In some embodiments, a ratio of the third thickness t3 to the fourth thickness t4 is between about 100 and about 150.

In some embodiments, the additional third coating 303-2 includes amorphous yttrium aluminate and the additional fourth coating 304-2 includes crystalline yttria. The additional third coating 303-2 and the additional fourth coating 304-2 can be formed using similar processes described above in connection to the third coating 303 and the fourth coating 304. For example, For amorphous yttrium aluminate formation, each cycle of alumina deposition uses TMA as a precursor for alumina and H2O as an oxidation agent. Each cycle of yttria deposition uses yttrium (III) tris(methylcyclopentadienyl) (Y(MeCp)3) as a precursor for yttria and H2O as an oxidation agent. Each cycle of yttria deposition uses yttrium (III) tris(methylcyclopentadienyl) (Y(MeCp)3) as a precursor for yttria and H2O as an oxidation agent.

Figure 6G:
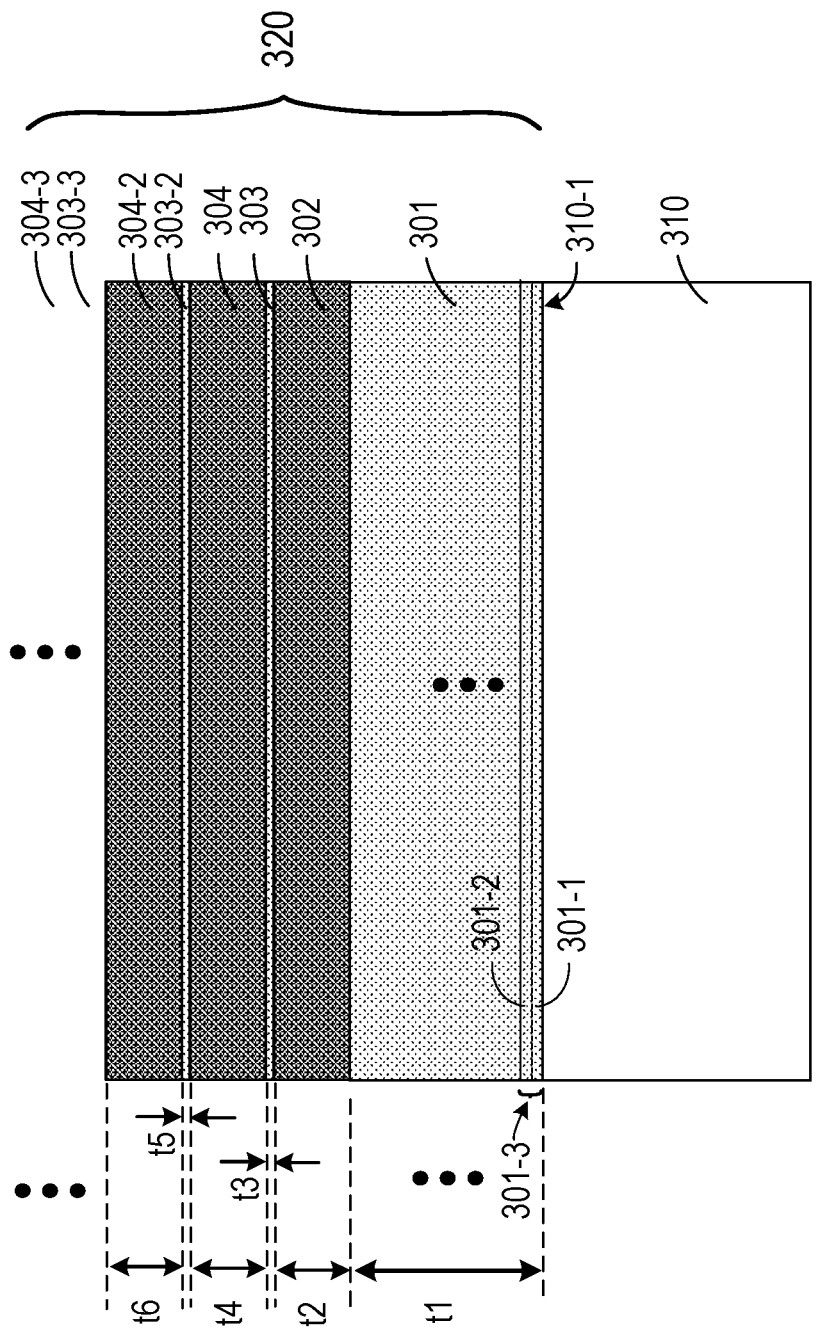

FIG. 6G shows an optional additional third coating 303-4 and an additional fourth coating 304-3, etc., until a total thickness of all the coatings, 301, 302, 303, 304, 303-1, 304-1, . . . , etc. reaches the target thickness. In some embodiments, the additional third coatings 303-4 can be similar to the first layer of the third coating 303, and the additional fourth coatings 304-4 can be similar to the first layer of the four coating 304. Depending on the application, the number of ALD cycles and the thickness of the coating film can vary. In some embodiments, the target thickness is in a range of 50 nm to 30 μm.

Figure 7:
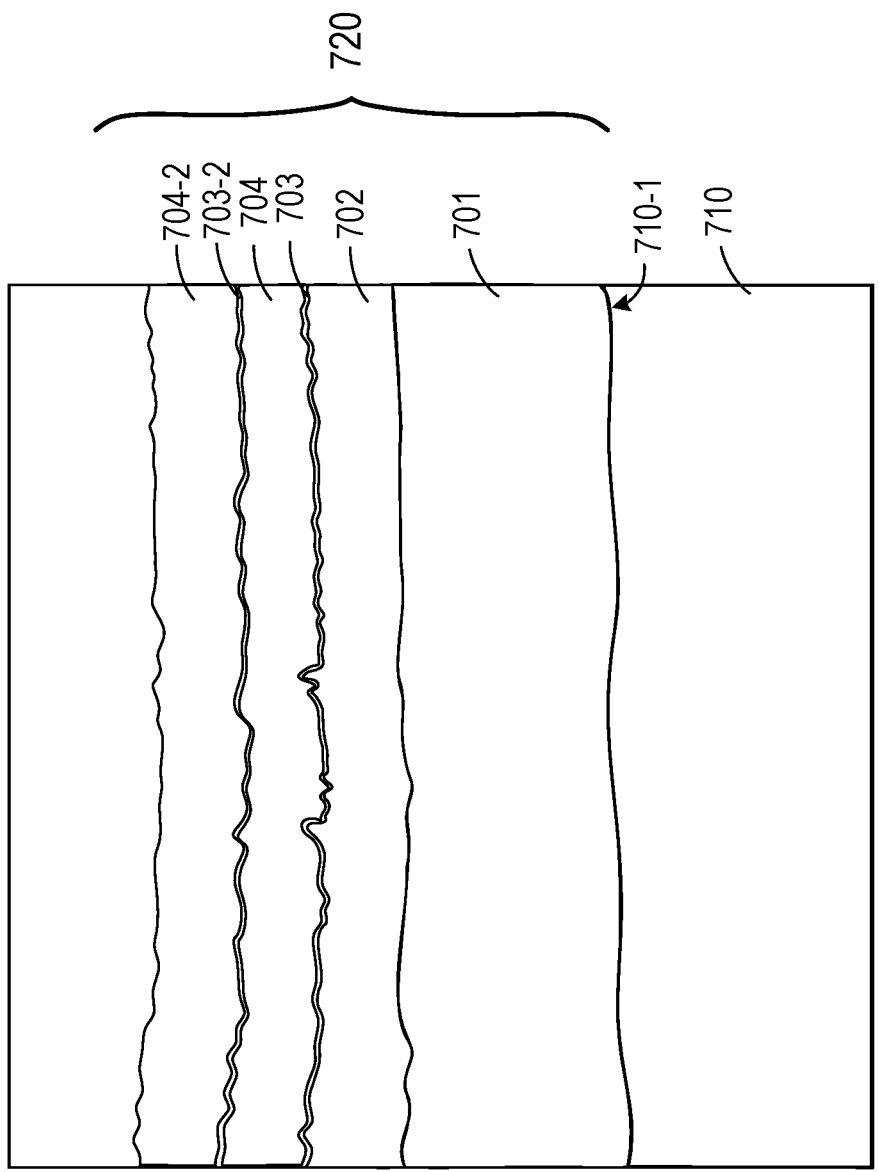
FIG. 7 is a TEM micrograph illustrating a cross-sectional view of a coating on a component in a semiconductor process chamber, in accordance with some embodiments.

FIG. 7 is a line drawing representation of a Transmission Electron Microscopy (TEM) micrograph illustrating a cross-sectional view of a coating on an article for a semiconductor process chamber, in accordance with some embodiments. FIG. 7 illustrates a cross-sectional view of an article 700 including a protective coating 720 on a surface 710-1 of the article body 710. The protective coating 720 includes a first coating 701 on the surface 710-1 of the article body 710. The first coating 701 includes amorphous rare earth metal-containing oxide formed by a first atomic layer deposition (ALD) process. In this example, the first coating 701 is an amorphous YAG layer. The protective coating 720 also includes a second coating 702 on the first coating 701. The second coating 702 includes crystalline rare earth metal oxide formed by a second atomic layer deposition (ALD) process. In this example, the second coating 702 is a crystalline $Y_2O_3$ layer. The protective coating 720 also includes a third coating 703 on the second coating 702. The third coating 703 includes amorphous rare earth metal-containing oxide formed by a third atomic layer deposition (ALD) process. In this example, the third first coating 703 is an amorphous YAG layer, similar to composition of the first coating 701, but substantially thinner. The protective coating 720 also includes a fourth coating 704 on the third coating 703. The fourth coating 704 includes crystalline rare earth metal oxide formed by a fourth atomic layer deposition (ALD) process. In this example, the fourth coating 704 is a crystalline $Y_2O_3$ layer, similar to the second coating 702 and has a similar thickness.

Figure 8:
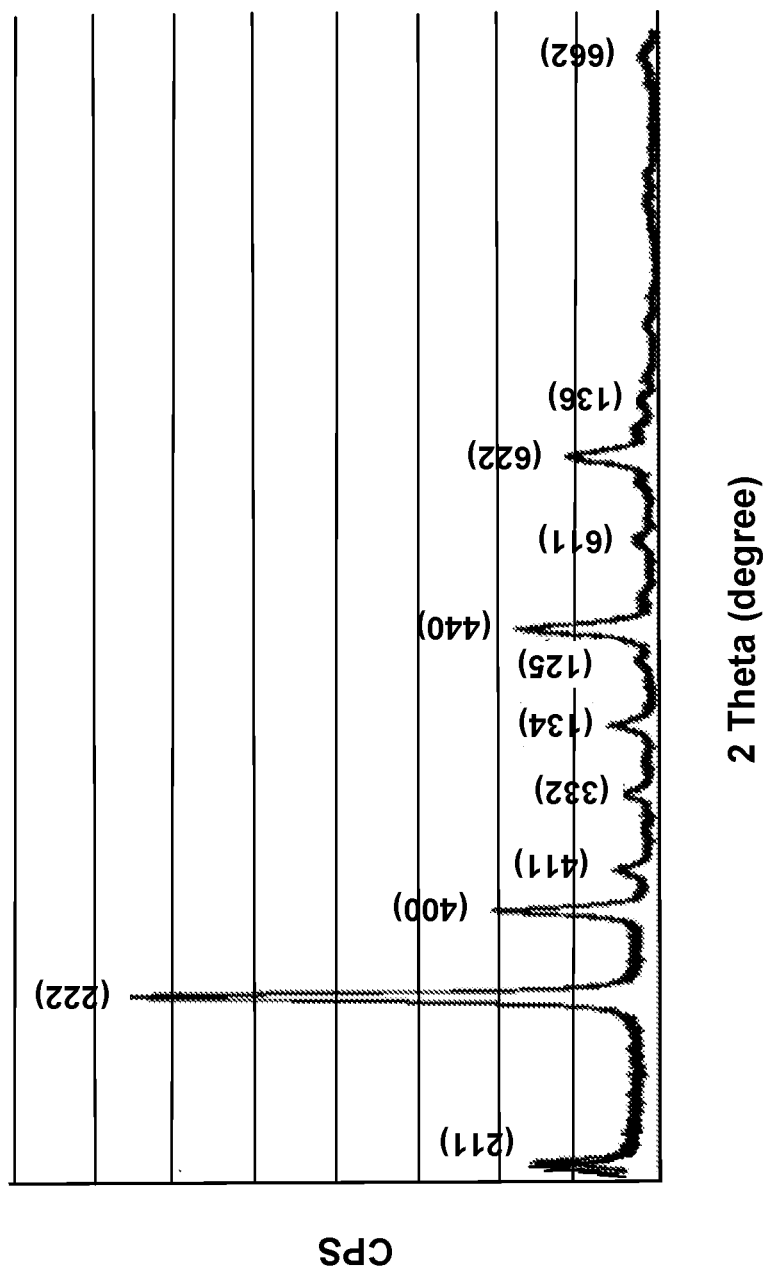
FIG. 8 is an X-ray diffraction (XRD) profile of a coating on a component in a semiconductor process chamber, in accordance with some embodiments.

FIG. 8 is an X-ray Diffraction (XRD) profile of a coating on a component for a semiconductor process chamber, in accordance with some embodiments. In FIG. 8, the horizontal axis shows the degree in 2 theta, and the vertical axis shows counts per second (CPS). The XRD profile depicted in FIG. 8 shows that the multilayer $Y_2O_3$/YAG coating is a cubic structure without preferred orientation growth.

Further experiments were carried out to test the effectiveness of the protective coating described above. For example, in a test in a chlorine (Cl) plasma for 8100 seconds, no change in the coating was observed in TEM analysis. In contrast, a sprayed coating of $Y_2O_3$ exhibited peeling in a 2700 seconds $Cl_2$ plasma test. In another test in 2700 second $SF_6$ plasma, the protective test formed by the method described above exhibited no change in the coating. In contrast, a spray coating of $Y_2O_3$ exhibited peeling. Similar results were also obtained in H2 plasma tests.

Some embodiments of this disclosure are directed to a rare earth metal-containing oxide coating structure formed by atomic layer deposition (ALD), that includes a coating of single amorphous layer on the substrate surface overlaid with a multilayer coating that includes alternating crystalline layers interleaved by thin amorphous layers. Formed by atomic layer deposition (ALD), the multilayer top coating structure with top multiple crystalline layers interrupted by thin amorphous layers provides a smooth top coating surface. The smooth top surface reduces the attachment of by-products The amorphous bottom coating provides strong adhesion to the substrate.

In some embodiments, the bottom amorphous layer has an yttrium aluminate composition, with a flexible mechanical property and provides a great adhesive strength with the substrate. In the top multilayered coating, thin amorphous yttrium aluminate layer between crystalline yttria layer plays a role to interrupt the yttria crystal growth and form a crystalline layer without preferred (400) orientation grain growth with small grain size and a smooth surface. In some embodiments, the top crystalline layer of yttria, with cubic crystal structure and small grain size, exhibits a higher hardness and shows excellent ion bombardment resistance and plasma radical erosion resistance.

In some embodiments, other materials can be used instead of the amorphous yttrium aluminate layer. For example, the amorphous yttrium aluminate layer can be substituted by amorphous alumina layer, amorphous magnesium aluminate layer, and amorphous gadolinium aluminate layer, or other suitable material with compatible lattice structures and chemical properties.

In some embodiments, a method includes forming a first coating on a surface of an article using a first atomic layer deposition (ALD) process, the first coating comprising amorphous yttrium aluminate and characterized by a first thickness, the first ALD process comprising a first number of repetitions of three cycles of alumina deposition followed by two cycles of yttria deposition to reach the first thickness. The method also includes forming a second coating on the first coating using a second atomic layer deposition (ALD) process, the second coating comprising crystalline yttria, the second coating characterized by a second thickness. The method also includes forming a third coating on the second coating using a third atomic layer deposition (ALD) process, the third coating comprising amorphous yttrium aluminate and characterized by a third thickness, the third ALD process comprising a second number of repetitions of three cycles of alumina deposition followed by two cycles of yttria deposition to reach the third thickness, wherein a ratio of the first number of repetitions to the second number of repetitions is between about 100 and about 150, and a ratio of the first thickness to the third thickness is between about 100 and about 150. The method further includes forming a fourth coating on the third coating using a fourth atomic layer deposition (ALD) process, the fourth coating comprising crystalline yttria and characterized by a fourth thickness.

In some embodiment, a method includes forming a first coating comprising amorphous rare earth metal-containing oxide on a surface of an article using a first atomic layer deposition (ALD) process that includes repeating a process of alumina deposition cycles followed by rare earth metal oxide deposition cycles N1 times, where N1 is an integer, the first coating characterized by a first thickness. The method also includes forming a second coating comprising crystalline rare earth metal oxide on the first coating using a second atomic layer deposition (ALD) process, the second coating characterized by a second thickness. The method further includes forming a third coating comprising amorphous rare earth metal-containing oxide on the second coating using a third atomic layer deposition (ALD) process that includes repeating a process of alumina deposition cycles followed by rare earth metal oxide deposition cycles N2 times, where N2 is an integer, the third coating characterized by a third thickness. The method also includes forming a fourth coating comprising crystalline rare earth metal oxide on the third coating using a fourth atomic layer deposition (ALD) process, the fourth coating characterized by a fourth thickness.

In some embodiments, an article includes a protective coating on a surface of an article body. The protective coating includes a first coating on the surface of the article body. The first coating includes amorphous rare earth metal-containing oxide formed by a first atomic layer deposition (ALD) process and characterized by a first thickness. The first coating includes a first number of layers of a composite layer including an amorphous rare earth metal-containing oxide layer on an amorphous alumina layer. The protective coating also includes a second coating on the first coating. The second coating includes crystalline rare earth metal-containing oxide formed by a second atomic layer deposition (ALD) process, and the second coating is characterized by a second thickness. The protective coating includes a third coating on the second coating. The third coating includes amorphous rare earth metal-containing oxide formed by a third atomic layer deposition (ALD) process and characterized by a third thickness. The third coating includes a second number of layers of a composite layer including an amorphous rare earth metal-containing oxide layer on an amorphous alumina layer. The protective coating further includes a fourth coating on the third coating. The fourth coating includes crystalline rare earth metal-containing oxide formed by a fourth atomic layer deposition (ALD) process and characterized by a fourth thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first coating directly on a surface of an article using a first atomic layer deposition (ALD) process, the first coating comprising amorphous yttrium aluminate and characterized by a first thickness, the first ALD process comprising a first number of repetitions of three cycles of alumina deposition followed by two cycles of yttria deposition to reach the first thickness;
    forming a second coating on the first coating using a second atomic layer deposition (ALD) process, the second coating comprising crystalline yttria, the second coating characterized by a second thickness;
    forming a third coating on the second coating using a third atomic layer deposition (ALD) process, the third coating comprising amorphous yttrium aluminate and characterized by a third thickness, the third ALD process comprising a second number of repetitions of three cycles of alumina deposition followed by two cycles of yttria deposition to reach the third thickness, wherein a ratio of the first number of repetitions to the second number of repetitions is between about 100 and about 150, and a ratio of the first thickness to the third thickness is between about 100 and about 150; and
    forming a fourth coating on the third coating using a fourth atomic layer deposition (ALD) process, the fourth coating comprising crystalline yttria and characterized by a fourth thickness.

2. The method of claim 1, further comprising repeating the third atomic layer deposition (ALD) process and fourth atomic layer deposition (ALD) process to repeatedly forming the third coating and the fourth coating until a sum of all coatings reach a target thickness.

3. The method of claim 1, wherein a total number of coatings comprising crystalline yttria is between about 2 to about 100.

4. The method of claim 1, wherein a thickness of coatings comprising crystalline yttria is between about 50 nm to about 500 nm.

5. The method of claim 1, wherein a thickness of the first coating comprising amorphous yttrium aluminate is between about 10 nm to about 500 nm.

6. The method of claim 1, wherein in the first and third atomic layer deposition (ALD) processes, each cycle of alumina deposition comprises using trimethylaluminium (TMA) as a precursor for alumina and H2O as an oxidation agent.

7. The method of claim 6, wherein in the first and third atomic layer deposition (ALD) processes, each cycle of yttria deposition comprises using yttrium (III) tris(methylcyclopentadienyl) (Y(MeCp)3) as a precursor for yttria and H2O as an oxidation agent.

8. The method of claim 7, wherein in the second and fourth atomic layer deposition (ALD) processes, each cycle of yttria deposition comprises using Y(MeCp)3 as a precursor for yttria and H2O as an oxidation agent.

9. A method for forming a protective coating on an article for semiconductor processing, the method comprising:
    loading the article for semiconductor processing in an atomic layer deposition (ALD) chamber;
    forming a first coating directly on a surface of the article for semiconductor processing using a first ALD process, the first coating comprising amorphous yttrium aluminate and characterized by a first thickness, the first ALD process comprising a first number of repetitions of three cycles of alumina deposition followed by two cycles of yttria deposition to reach the first thickness;
    forming a second coating on the first coating using a second ALD process, the second coating comprising crystalline yttria, the second coating characterized by a second thickness;
    forming a third coating on the second coating using a third ALD process, the third coating comprising amorphous yttrium aluminate and characterized by a third thickness, the third ALD process comprising a second number of repetitions of three cycles of alumina deposition followed by two cycles of yttria deposition to reach the third thickness, wherein a ratio of the first number of repetitions to the second number of repetitions is between about 100 and about 150, and a ratio of the first thickness to the third thickness is between about 100 and about 150; and
    forming a fourth coating on the third coating using a fourth ALD process, the fourth coating comprising crystalline yttria and characterized by a fourth thickness.

10. The method of claim 9, further comprising repeating the third ALD process and fourth ALD process to repeatedly forming the third coating and the fourth coating until a sum of all coatings reach a target thickness.

11. The method of claim 9, wherein a total number of coatings comprising crystalline yttria is between about 2 to about 100.

12. The method of claim 9, wherein a thickness of coatings comprising crystalline yttria is between about 50 nm to about 500 nm.

13. The method of claim 9, wherein a thickness of the first coating comprising amorphous yttrium aluminate is between about 10 nm to about 500 nm.

14. The method of claim 9, wherein in the first and third ALD processes, each cycle of alumina deposition comprises using trimethylaluminium (TMA) as a precursor for alumina and H2O as an oxidation agent.

15. The method of claim 14, wherein in the first and third ALD processes, each cycle of yttria deposition comprises using yttrium (III) tris(methylcyclopentadienyl) (Y(MeCp) 3) as a precursor for yttria and H2O as an oxidation agent.

16. The method of claim 15, wherein in the second and fourth ALD processes, each cycle of yttria deposition comprises using Y(MeCp)3 as a precursor for yttria and H2O as an oxidation agent.

17. The method of claim 9, wherein the article for semiconductor processing is a process kit.

18. A method for processing a process kit used in a plasma processing chamber, the method comprising:
  loading the process kit in an atomic layer deposition (ALD) chamber;
  forming a first coating directly on a surface of the article for semiconductor processing using a first ALD process, the first coating comprising amorphous yttrium aluminate and characterized by a first thickness, the first ALD process comprising a first number of repetitions of three cycles of alumina deposition followed by two cycles of yttria deposition to reach the first thickness;
  forming a second coating on the first coating using a second ALD process, the second coating comprising crystalline yttria, the second coating characterized by a second thickness;
  forming a third coating on the second coating using a third ALD process, the third coating comprising amorphous yttrium aluminate and characterized by a third thickness, the third ALD process comprising a second number of repetitions of three cycles of alumina deposition followed by two cycles of yttria deposition to reach the third thickness, wherein a ratio of the first number of repetitions to the second number of repetitions is between about 100 and about 150, and a ratio of the first thickness to the third thickness is between about 100 and about 150;
  forming a fourth coating on the third coating using a fourth ALD process, the fourth coating comprising crystalline yttria and characterized by a fourth thickness; and
  assembling the process kit in the plasma processing chamber.

19. The method of claim 18, further comprising repeating the third ALD process and fourth ALD process to repeatedly forming the third coating and the fourth coating until a sum of all coatings reach a target thickness.

20. The method of claim 19, wherein the target thickness is in a range of 50 nm to 30 μm.

* * * * *